United States Patent [19]

Sachs et al.

[11] Patent Number: 5,600,285

[45] Date of Patent: Feb. 4, 1997

[54] MONOLITHIC STRIPLINE CROSSOVER COUPLER HAVING A PYRAMIDAL GROUNDING STRUCTURE

[75] Inventors: Richard A. Sachs, West Hempstead; Robert G. Danehy, White Plains, both of N.Y.

[73] Assignee: Unisys Corporation, Blue Bell, Pa.

[21] Appl. No.: 342,325

[22] Filed: Nov. 18, 1994

[51] Int. Cl.$^6$ ........................................... H01P 3/08
[52] U.S. Cl. .................................... 333/1; 333/245
[58] Field of Search ............................. 333/1, 245, 246

[56] References Cited

U.S. PATENT DOCUMENTS 3,104,363  9/1963  Butler ............................... 333/246
4,533,883  8/1985  Hudspeth et al. .................. 333/1
5,117,207  5/1992  Powell et al. ...................... 333/1

FOREIGN PATENT DOCUMENTS 178703  9/1985  Japan ................................ 333/246
4165701  6/1992  Japan ................................ 333/246
5-48306  2/1993  Japan ................................ 333/1

Primary Examiner—Benny Lee
Attorney, Agent, or Firm—Seymour Levine; Mark T. Starr

[57] ABSTRACT

A coupler for crossing striplines which would otherwise intersect in a region of the substrate includes an electrically conducting housing through which transmission lines are passed that couple ends of the crossing striplines, formed by removing the cross-over region on the substrate. The housing is coupled to the stripline ground plane and provides ground planes for the coupling transmission lines.

4 Claims, 6 Drawing Sheets

5,600,285

1

MONOLITHIC STRIPLINE CROSSOVER COUPLER HAVING A PYRAMIDAL GROUNDING STRUCTURE

BACKGROUND OF THE INVENTION

1. Field of the Invention

The invention relates to the field of stripline circuitry, and more particularly to cross-over configurations that maintain isolation between two independent potentially intersecting striplines on a planar circuit.

2. Description of the Prior Art

Monolithic planar stripline circuitry at times requires two lines to cross paths. Since the striplines are independent, the crossing paths must be arranged in a manner that maintains electrical isolation between the striplines. One method for accomplishing such a cross-over in the prior art positions a second stripline layer beneath the first stripline layer and performs the cross-over on the second layer. If the phase relationship between the striplines is not a consideration, the cross-over can be accomplished by breaking one of the crossing striplines in the cross-over region and providing a transition from one section of the broken stripline to a secondary stripline on the second layer. The secondary stripline crosses the non-broken line on the second layer. A transition from the secondary stripline to the other section of the broken stripline completes the cross-over.

If the phase relationship between the striplines must be maintained, both striplines are broken in the cross-over region and coupled to secondary striplines on the second layer with transitions as previously discussed. These secondary striplines are arranged on the second layer to be non-contacting and to have equal line lengths, thus providing a cross-over which maintains the phase relationship between the crossing lines. Such a crossover consists of four gold plated pins, eight delicate free standing solder connections, four dielectric beads, at least four spacers, and thirty-two bolts with accompanying nuts, lock washers, and flat washers. The mechanical complexity of a two layer stripline circuit causes its fabrication to be extremely costly and the results in a structure that is large and heavy.

A technique in the prior art for realizing a stripline cross-over for a planar circuit, without using a second dielectric layer, breaks the crossing lines in the cross-over region and transfers each section of the broken lines to connectors positioned at an edge of the stripline structure. Cables are then utilized to couple the corresponding sections of the crossing striplines. This technique does not maintain the phase relationship between the crossing striplines as well as the secondary lines on a second dielectric substrate. Though the connector-cable approach provides poorer performance than the secondary line approach, it results in similar size, cost, and complexity.

Another cross-over method of the prior art does not break the two intersecting lines. This method is disclosed in U.S. Pat. No. 5,510,757 issued to Kumai et al, which is assigned to the assignee of the present invention. In this method the first line is deposited on the substrate and runs continuously through the cross-over region. A dielectric layer is deposited over the first line in the cross-over region and the second line is deposited on the substrate and over the dielectric layer. To provide a ground in the cross-over region holes are bored through the substrate to the ground plane and filed with electrical conducting material from the ground plane to the surface of the substrate. This type of cross-over, though relatively simple, establishes a stripline characteristic impedance in the crossover region that differs from the stripline characteristic impedance on substrate.

SUMMARY OF THE INVENTION

In accordance with the principles of the present invention, a cross-over of two intersecting strips is provided by removing the sections of the intersecting transmission lines in the cross-over region and coupling the ends created by the section removals to a cross-over coupler, wherein corresponding ends are coupled in a manner that provides a continuous transition through the cross-over region with isolation between the crossing transmission lines and a minimum change in characteristic impedance.

In one preferred embodiment the cross-over region of the substrate is removed and a housing made of conducting material is positioned therethrough in electrical contact with the system ground. Two coaxial cables, having characteristic impedance substantially equal to that of the transmission lines, are passed through the housing and the inner conductors of the coaxial lines are respectively coupled to the strip ends on the substrate at the cross-over region to establish continuous transmission lines. The outer conductors of the coaxial lines are positioned in contact with the housing, thus creating a common ground for the transmission lines and the coaxial cables.

In a second preferred embodiment the cross-over region is removed and the electrical ground is extended through the space created by the removal of the cross-over region to provide an upper and a lower channel. A strip section, coupled to the strip ends on the substrate created by the removal of a portion of a first strip in the cross-over region, is shaped to pass through the lower channel with spacings from the extended ground to establish a characteristic impedance which is equal to the characteristic impedance of the transmission lines away from the cross-over region. Another strip section, coupled to the strip ends on the substrate created by the removal of a portion of a second strip in the cross-over region, is shaped to pass through the upper channel with spacings from the extended ground to establish a characteristic impedance which is equal to the characteristic impedance of the transmission lines away from the cross-over region. Thus the two crossing striplines maintain the characteristic impedance in the cross-over coupler of the transmission lines, formed by the metallic strips on the substrate and the electrical ground, continuously from the ends on the substrate at cross-over region through the cross-over coupler, thereby substantially eliminating reflection caused by discontinuities at the junction of the cross-over and the transmission lines of the system.

DESCRIPTION OF THE PREFERRED EMBODIMENTS

In the microwave art two types of strip transmission lines are utilized: one, known as microstrip, comprises a metallic strip mounted on a substrate which is positioned over a single ground; the second, known as stripline, comprises a metallic strip mounted on a substrate which is sandwiched between two ground planes. The novel transmission line cross-overs disclosed herein are applicable to both stripline and microstrip.

Figure 1:
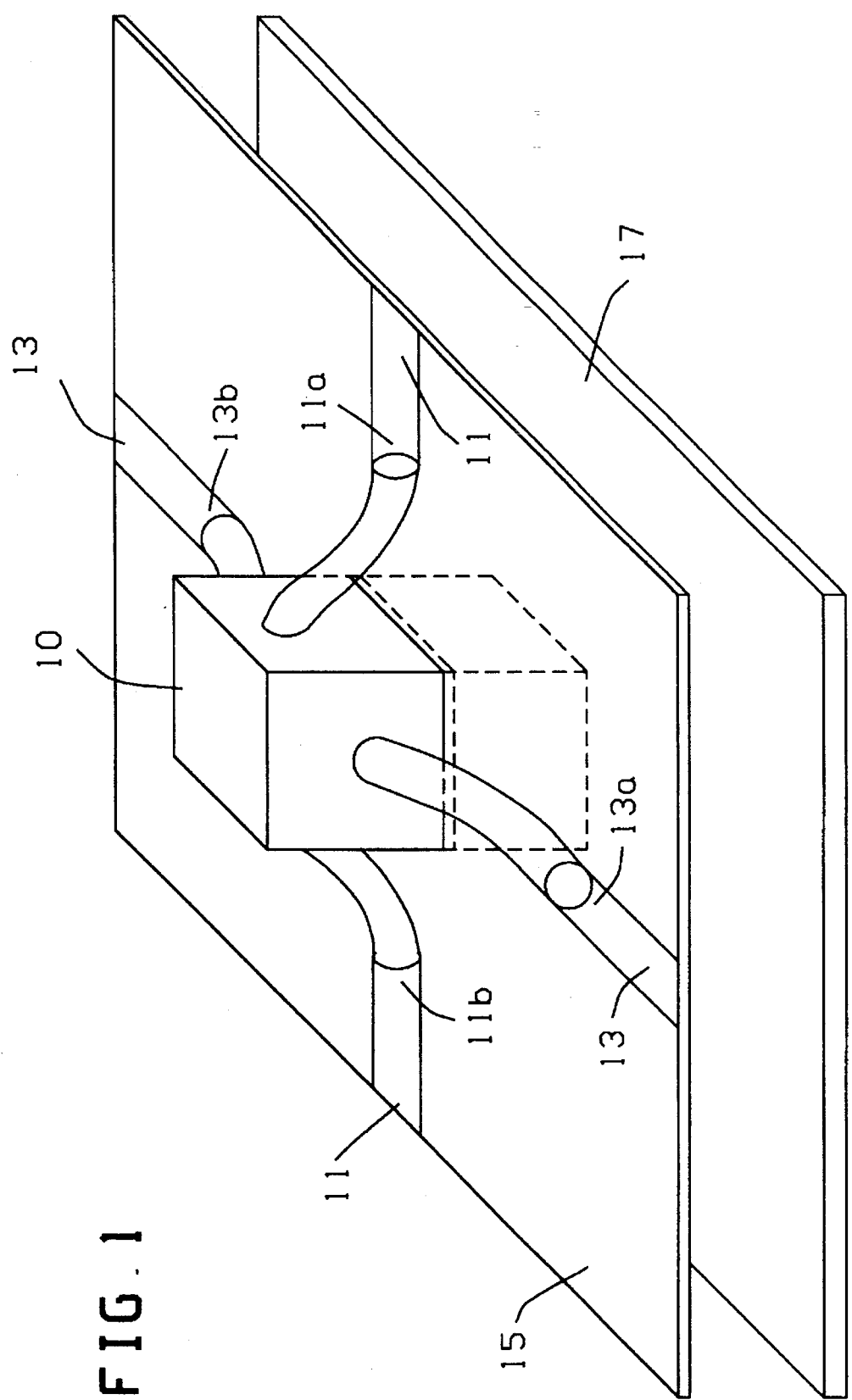
FIG. 1 is a schematic diagram of a cross-over coupler positioned in a stripline circuit for achieving a cross-over of two crossing striplines.

Refer now to FIG. 1 wherein a cross-over coupler 10 coupled to crossing striplines 11 and 13 on a substrate 15 is shown. The cross-over coupler 10 extends through an opening in the substrate, created by the removal of the cross-over region, to be in electrical contact with the ground plane 17. As will be explained, the electrical contact with the ground plane and the construction extend the ground plane 17 into the cross-over coupler 10. Cross-over coupler 10 is constructed and arranged to maintain the characteristic impedance of the transmission lines, formed by the combination of metallic strip, substrate, and ground, through the cross-over coupler. Ends 11a and 11b of stripline 11 and ends 13a and 13b of stripline 13, at the removed cross-over region of the substrate 15, are coupled to the cross-over coupler 10 in a manner that provides a substantially reflection free interface. Thus, as will explained, one strip is crossed over another with the characteristic impedance of the crossing transmission lines maintained through the cross-over coupler. The maintenance of the characteristic impedances results in a minimum reflection coefficient due to the insertion of the cross-over coupler.

Figure 2:
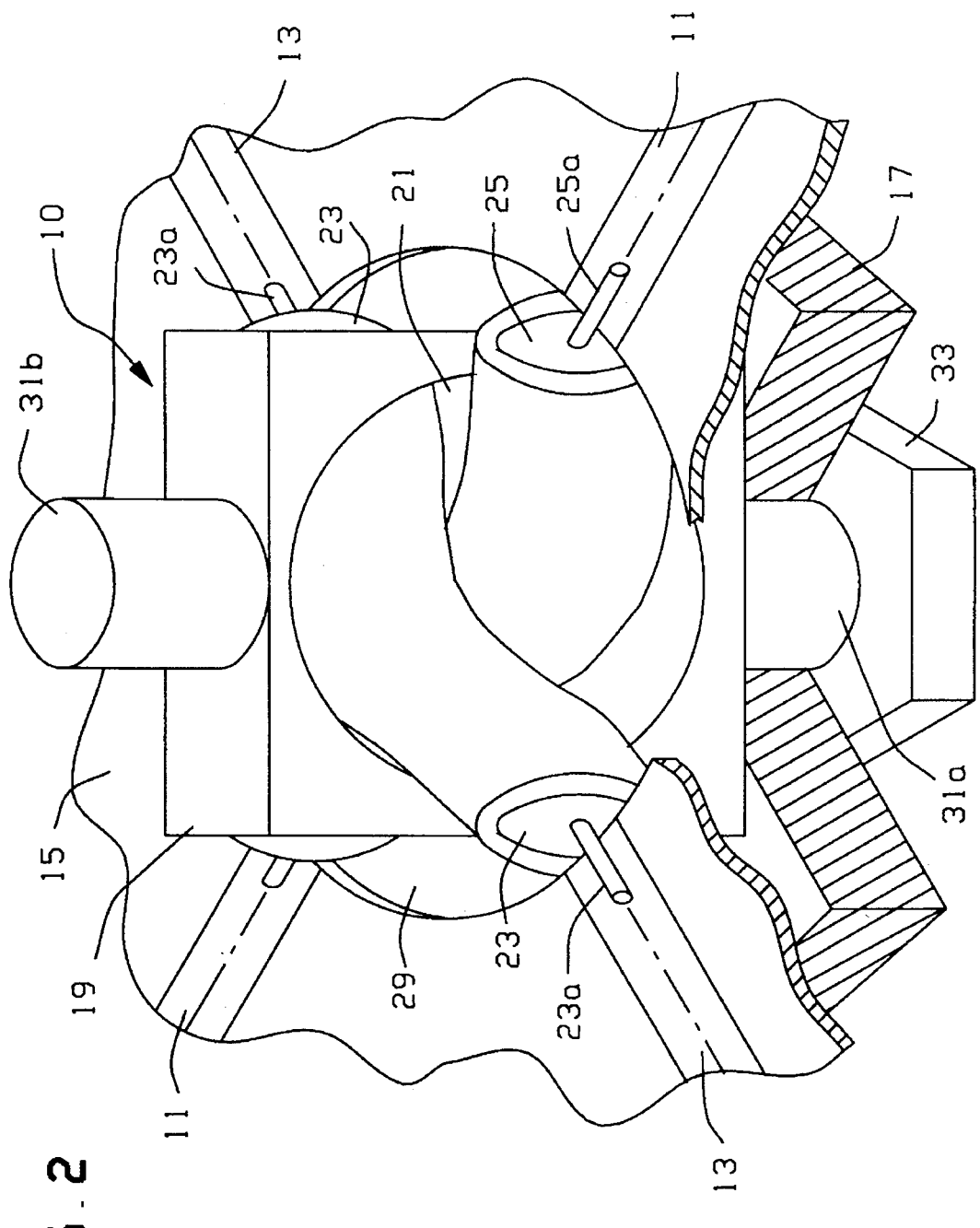
FIG. 2 is an illustration of a preferred embodiment of the invention.

Refer now to FIG. 2. In FIG. 2, and all subsequent figures, elements previously referenced bear the initially assigned reference numerals. In this embodiment of the invention, coupler 10 includes a housing 19, made of electrical conducting material, containing a passage 21 through which crossing coaxial transmission lines 23 and 25 are passed. The coaxial lines 23 and 25 are precut, shaped, and have exposed outer conductors which are electrically bonded to the housing 19 with solder to insure good electrical contact of the outer conductors to the housing. The entire assembly is inserted through an opening 29 in the substrate 15 and is maintained in electrical contact with the ground, for the microstrip version, by means of a metallic thread 31a, integral with the housing, which extends from the housing 19 through the ground plane 17, and a nut 33. For the stripline version, the housing is maintained in electrical contact with the ground by the metallic thread 31a and nut 33 and a second metallic thread 31b, integral with the housing and oppositely positioned to the metallic thread 31a, which extends from the housing through the upper ground plane, not shown, and a second nut, not shown. The outer conductors of the coaxial lines 23 and 25 are insulated from the striplines 11 and 13 either by an air gap or other insulating material. Coaxial cables 23 and 25 have characteristic impedances that are substantially equal to the characteristic impedances of the striplines 11 and 13 and are respectively coupled to the transmission lines which include strips 11 and 13 by soldering extended inner conductors 23a and 25a of the coaxial lines over an appropriate length of the conductors on the surface of the substrate 15. The coaxial lines 23 and 25 are of equal length to maintain the relative phase relationship between the transmission lines which include the strips 11 and 13. This length is adjusted to minimize standing waves due to reflections caused by the coupling of the coaxial transmission lines to the crossing transmission lines.

Figure 3:
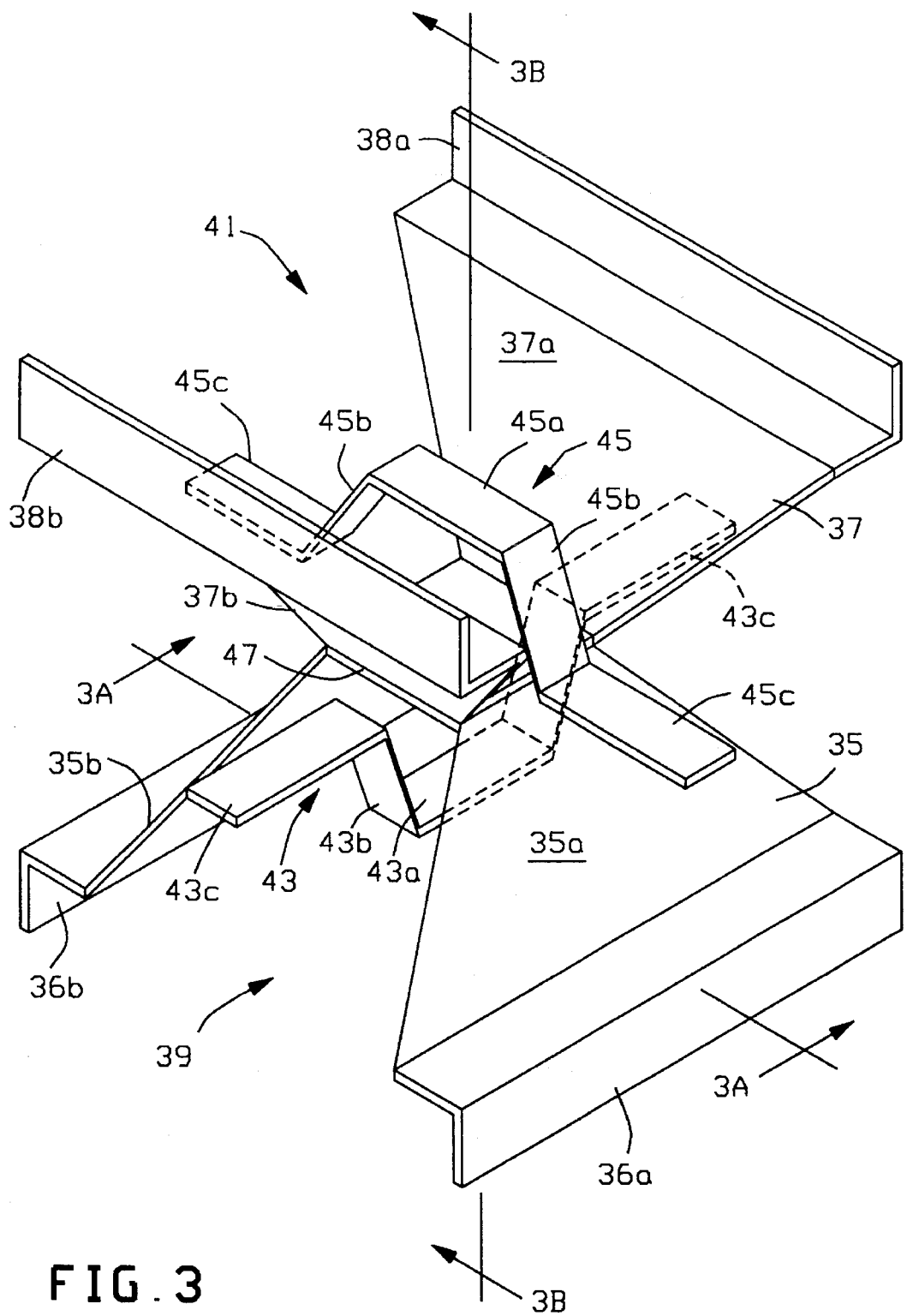
FIG. 3 is an illustration of a second preferred embodiment of the invention configured for a microstrip transmission line.
Figure 3A:
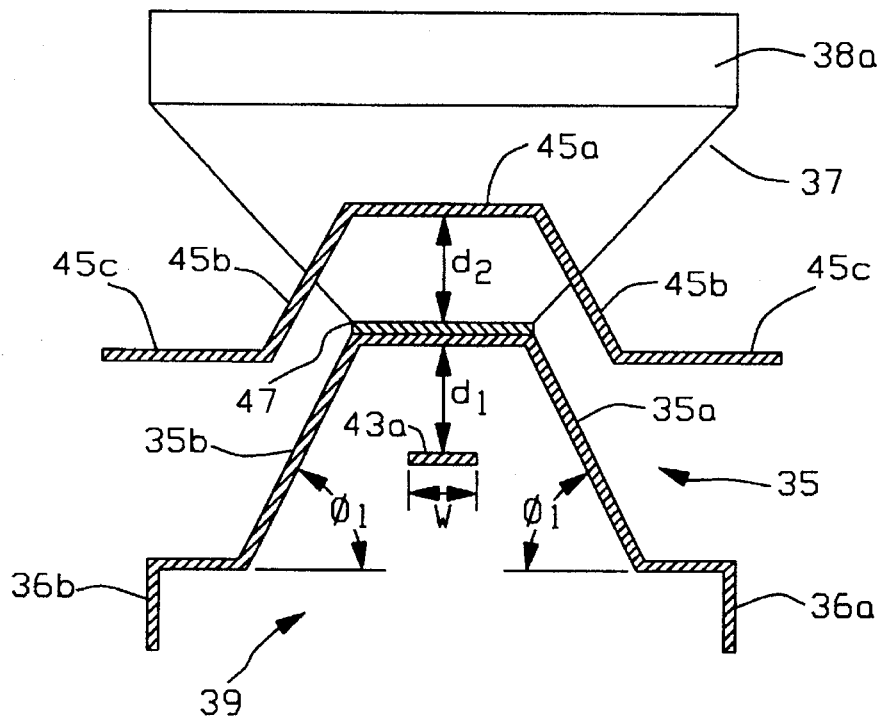
FIGS. 3A and 3B are drawings of cross-sectional views in FIG. 3.
Figure 3B:
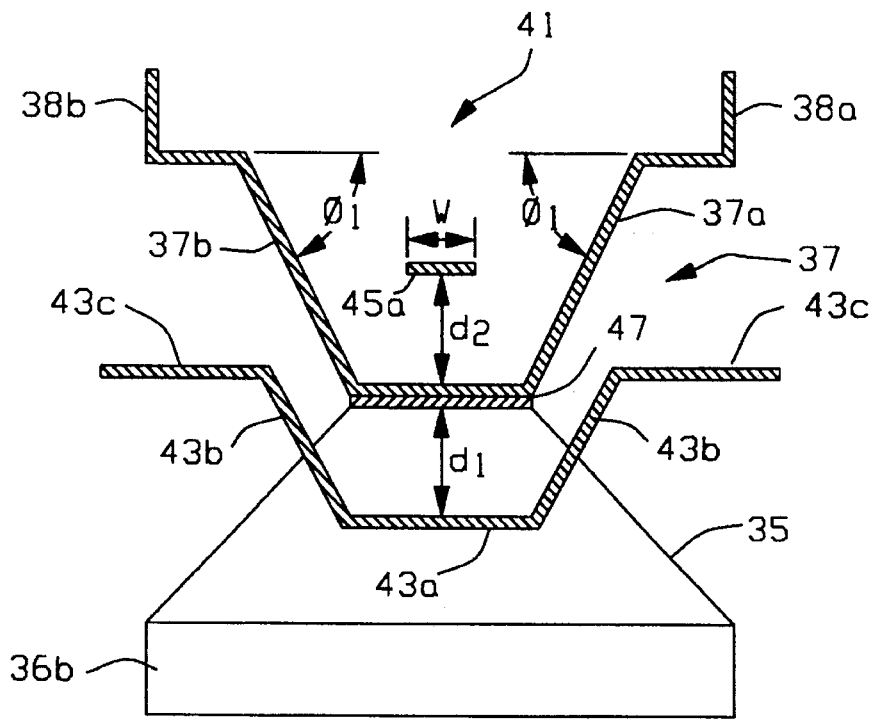

Refer now to FIGS. 3, 3A, and 3B, which are representations of a microstrip crossover. In these figures, for clarity, the substrate on which the strip conductors are deposited and the ground plane are not shown. The ground sections of the plane 17 in FIG. 1 and substrate are removed in the cross-over region. Electrical grounds for the cross-over region, connected to the ground plane 17, are formed by a lower truncated pyramid shaped structure 35 and an upper truncated pyramid shaped structure 37. One pair of opposite walls of each of the pyramid shaped structures 35 and 37 are open to form substantially perpendicular channels 39 and 41, respectively, through which strips 43 and 45 of electrical conducting material, having widths equal to that of the strips deposited on the substrate, may pass. A second pair of opposite walls of the pyramids are electrically conducting extensions of the ground plane 17.

Strip 43 is comprised of five sections a first section 43a, second and third sections both designated 43b, and fourth and fifth sections both designated 43c. As shown in FIG. 3A, the first section 43a is centrally positioned in channel 39 at a distance $d_1$ from and parallel to a ground plane 47, formed at the intersection of, and common to, the two truncated pyramids 35 and 37. Pyramidal side walls 35a and 35b are formed at an angle $\theta_1$, shown in FIG. 3A, so that the width W of the strip 43a, in combination with the spacing $d_1$ of strip section 43a from the ground plane 47, form a transmission line with a characteristic impedance in the channel 39 that is equal to the characteristic impedance of the microstrip transmission lines formed by the metallic strip on the substrate and the ground plane. Electrically conducting walls 36a and 36b, perpendicularly oriented to the common ground plane 47 extend from side walls 35a and 35b, respective. These perpendicular extensions provide additional isolation of the microstrip lines from the surrounding environment, while only minimally effecting the characteristic impedance. The second and third sections 43b, shown in FIG. 3B, are, respectively, parallel to and traverse a portion of the lengths of the electrically conducting sides 37a, 37b of the pyramid shaped structure 37 at a distance therefrom that maintains the characteristic impedance of the microstrip transmission line. Electrically conducting walls 38a and 38b, perpendicularly oriented to the common ground plane 47, extend from side walls 37a and 37b, respectively. These perpendicular extensions provide additional isolation of the microstrip lines from the surrounding environment, while only minimally effecting the characteristic impedance. The fourth and fifth sections 43c are coupled, which may be by soldering, to the strips deposited on the substrate.

Similarly, strip 45 is comprised of five sections, a first section 45a, second and third sections both designated 45b, and fourth and fifth sections both designated 45c. As shown in FIG. 3B, the first section 45a is centrally positioned in channel 41 at a distance $d_2$ from and parallel to the common ground plane 47. Pyramidal side walls 37a and 37b are formed at an angle $\phi_1$, shown in FIG. 3B, so that the width W of the strip 45a, in combination with the spacing $d_2$, form a transmission line with a characteristic impedance that is equal to the characteristic impedance of the transmission lines formed by the metallic strips on the substrate and the ground. The second and third sections 45b, are, respectively, parallel to the electrically conducting sides 35a, 35b of the pyramid shaped structure 35 and traverse a portion of the lengths of these sides at a distance therefrom that maintains the characteristic impedance of microstrip transmission lines. The fourth and fifth sections 45c are coupled, which may be by soldering, to the strips deposited on the substrate.

The lengths of the strips 43 and 45 are made equal to preserve the phase relationship between the crossing microstrip transmission lines. Strips 43 and 45 in the cross-over coupler are substantially of the same dimensions of the strips deposited on the substrate. Consequently, reflections at the coupling points are small if not non-existing. Since the ground plane position relative to the strip 43 in the channel 39 is reversed from that of ground plane position relative to strip deposited on the substrate, those skilled in the art should recognize that a 180° phase reversal of a propagating signal occurs at the transitions to the cross-over coupler on the transmission line formed by the strip 43 and the ground plane 47. Phase reversals occur at the transition from the stripline to the cross-over coupler and from the cross-over coupler to the stripline. Therefore, a full 360° phase reversal occurs and the phase along the transmission line is preserved.

Figure 4:
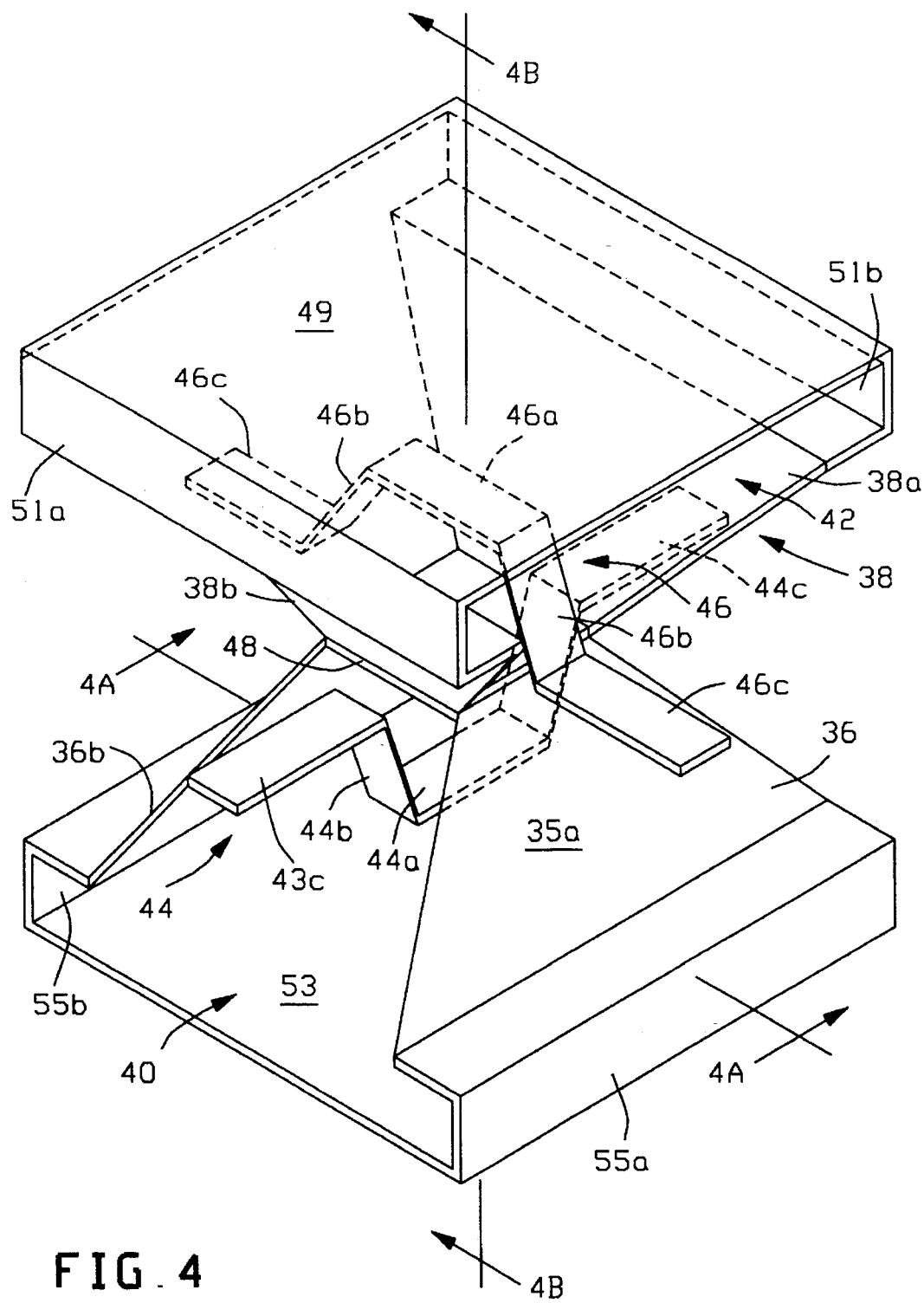
FIG. 4 is an illustration of the second preferred embodiment of the invention configured for a stripline transmission line.
Figure 4A:
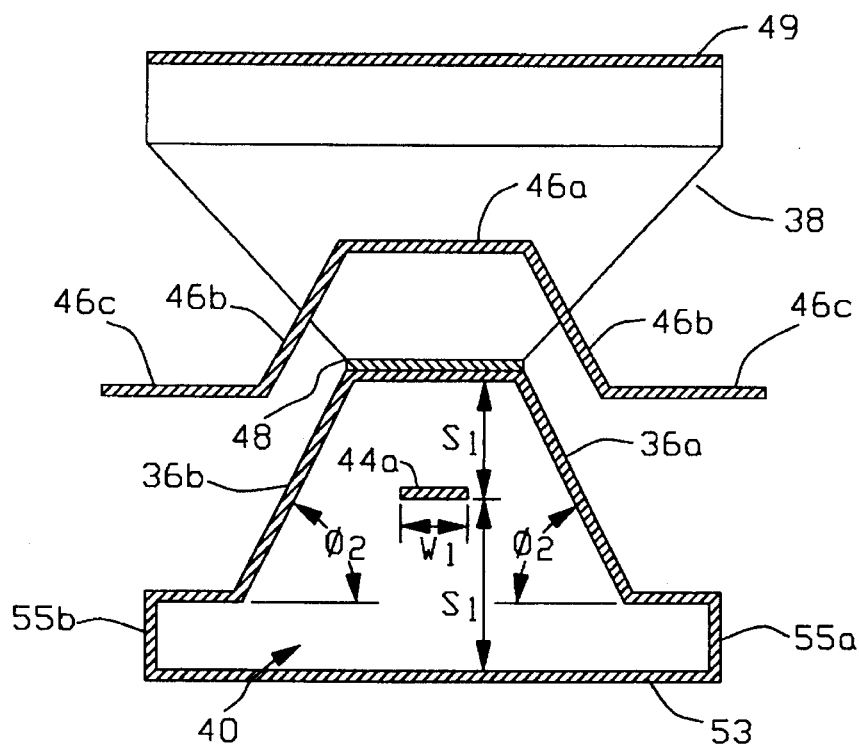
FIGS. 4A and 4B are drawings of cross-sectional views in FIG. 4.
Figure 4B:
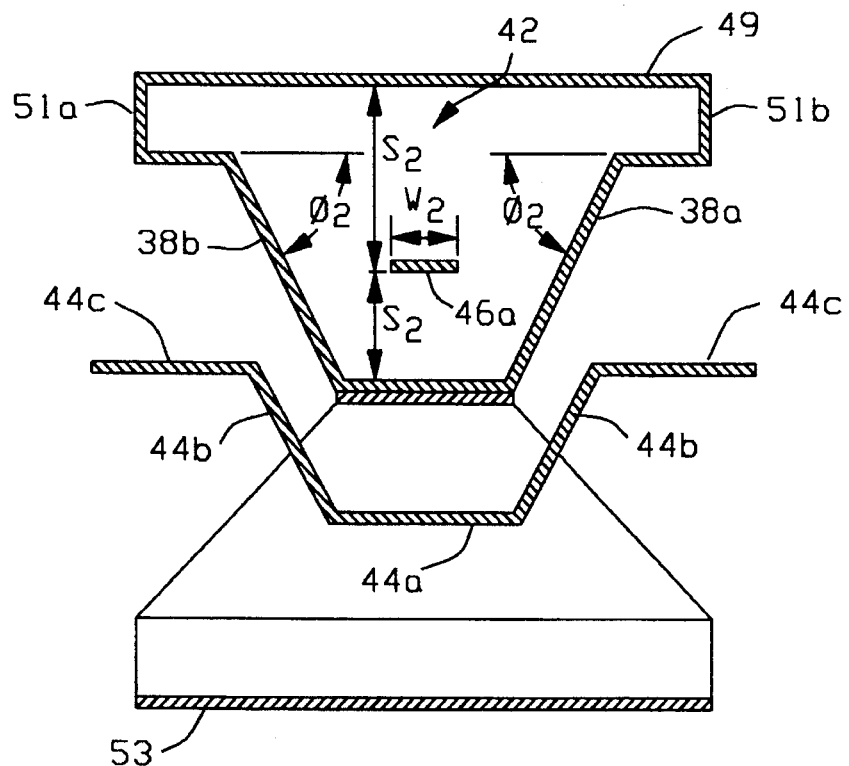

Refer now to FIGS. 4, 4A, and 4B, which are representations of a stripline crossover. In these figures, for clarity, the substrate on which the strip conductors are deposited and the ground planes are not shown. Referring to FIG. 4, the ground sections of the plane 17 in FIG. 1 and substrate are removed in the cross-over region. As in the microstrip version, electrical grounds for the cross-over region, connected to the ground plane 17, are formed by a lower truncated pyramid shaped structure 36 and an upper truncated pyramid shaped structure 38. One pair of opposite walls of each of the pyramid shaped structures 36 and 38 are open to form substantially perpendicular channels 40 and 42, respectively, through which strips 44 and 46 of electrical conducting material may pass. A metallic plate 49 may extend between the vertical sides 51a and 51b of the channel 42 for the entire length of the channel. Similarly, a metallic plate 53 may extend between the vertical sides 55a and 55b of the channel 40 for the entire length of the channel. The metallic plates 49 and 53 are second ground planes which, with a common ground plane 48 formed at the intersection of the two truncated pyramids 36 and 38, establish striplines in the channels 42 and 40, respectively.

Strip 44 is comprised of five sections a first section 44a, second and third sections both designated 44b, and fourth and fifth sections both designated 44c. As shown in FIG. 4A, the first section 44a is centrally positioned in channel 40 at equal distances $s_1$ from and parallel to the common ground plane 48. Pyramidal side walls 36a and 36b are formed at an angle $\theta_2$, shown in FIG. 4A, so that the width $W_1$ of the strip 44a, in combination with the spacing $s_1$ of strip section 44a form a transmission line with a characteristic impedance in the channel 40 that is equal to the characteristic impedance of the stripline formed by the metallic strip on the substrate and the ground plane. The second and third sections 44b, shown in FIG. 4B, are, respectively, parallel to and traverse the a portion of the lengths of the electrically conducting sides 38a, 38b of the pyramid shaped structure 38, in a microstrip fashion, at a distance therefrom which maintains the characteristic impedance of the stripline. The fourth and fifth sections 44c are coupled, which may be by soldering, to the strips deposited on the substrate.

Similarly, strip 46 is comprised of five sections, a first section 46a, second and third sections both designated 46b, and fourth and fifth sections both designated 46c. As shown in FIG. 4B, the first section 46a is centrally positioned in channel 42 at a distance $s_2$ from and parallel to the common ground plane 48 and the ground plane 49. Pyramidal side walls 38a and 38b are formed at an angle $\phi_2$, shown in FIG. 4B, so that the width $W_2$ of the strip 46a, in combination with the spacing $s_2$, form a transmission line with a characteristic impedance that is equal to the characteristic impedance of the transmission lines formed by the metallic strips on the substrate and the ground. The second and third sections 46b, are, respectively, parallel to the electrically conducting sides 36a, 36b of the pyramid shaped structure 36 and traverse a portion of the lengths of these sides, in microstrip fashion, at a distance therefrom that maintains the characteristic impedance of striplines. The fourth and fifth sections 46c are coupled, which may be by soldering, to the strips deposited on the substrate.

Though the transitions from the stripline in the cross-over region on the substrate to the stripline in the cross-over coupler is shown as through a microstrip configuration in FIGS. 4, 4A, and 4B, it should be recognized that this is not a necessity and that the transition may be accomplished in stripline by appropriately extending the ground planes 48, 49, and 53. It should be recognized that the two channels may be identical, i.e. $w_1=w_2$, $s_1=s_2$, and $\theta_2=\phi_2$. Further, the overall height of the cross-over coupler may be reduced by making the width of the metallic strips 44a and 46a narrower than the metallic strips on the substrate and having the spacings $s_1$, $s_2$ between the ground planes appropriately less than the spacing between the grounds on either side of the substrate in a manner that maintains the characteristic impedance of the crossing striplines.

The lengths of the strips 44 and 46 are made equal to preserve the phase relationship between the crossing microstrip transmission lines. Strips 44 and 46 in combination with the various ground planes associated therewith maintain the characteristic impedance of the stripline system. Consequently, the phase of the crossing striplines is maintained and reflections at coupling points are small, if not non-existing.

While the invention has been described in its preferred embodiments, it is to be understood that the words which have been used are words of description rather than limitation and that changes may be made within the purview of the appended claims without departing from the true scope and spirit of the invention its broader aspects.

We claim:

1. A cross-over coupler comprising:

a housing comprising first and second pyramids truncated by an electrically conducting common ground plane, said first and second pyramids each having one pair of electrically conducting opposite facing sides extending from said common ground plane and one pair of opposite facing sides open to respectively provide first and second channels through said housing;

a first transmission line comprised of a first electrical conductor traversing said first channel at a first predetermined level below said common ground plane;

a second transmission line comprised of a second electrical conductor traversing said second channel at a second predetermined level above said common electrical ground plane;

said first and second electrical conductors respectively comprising five sections, corresponding first sections of said first and second conductors being parallel to said common ground plane, corresponding second and third sections, of said first and second electrical conductors, extending from opposite ends of said first section parallel to said opposite electrical conductor sides of said first and second pyramids, respectively, at a preselected distance therefrom and corresponding fourth and fifth sections respectively extending from said second and third sections parallel to said common ground plane;

first and second electrical conducting sheets respectively extending, with a perpendicular orientation to said common ground plane, from said oppositely facing sides of said first pyramid; and third and fourth electrical conducting sheets respectively extending, with a perpendicular orientation to said common ground plane, from said oppositely facing sides of said second pyramid.

2. A cross-over coupler in accordance with claim 1 wherein said first and second electrical conductors have equal lengths.

3. A cross-over coupler in accordance with claim 1 further including:

a first additional electrical conducting sheet extending between and coupled to said first and second electrical conducting sheets, said first additional electrical conducting sheet being oriented parallel to said common ground plane; and a second additional electrical conducting sheet extending between and coupled to said third and fourth electrical conducting sheets, said second additional electrical conducting sheet being oriented parallel to said common ground plane.

4. A method for crossing first and second electrical conducting strips in a cross-over region, said first and second conducting strips positioned relative to an electrical ground system, the method comprising the steps of:

establishing a pyramidal structure having first and second pyramidal structures having first and second channels, respectively, truncated by a common ground plane, one pair of opposite facing sides of said pyramidal structure being electrical conductors extending from said electrical ground system to said common ground plane and a second pair of opposite facing electrical conducting sides extending from said common plane to form said second channel;

passing a first electrical conductor through said first channel at a predetermined level below said common ground plane and a second electrical conductor through said second channel at said predetermined level above said common ground plane;

respectively providing said first and second electrical conductors in five sections;

positioning respective first sections of said first and second electrical conductors in parallel with said common ground plane;

extending second and third sections of said first electrical conductor, respectively, from opposite ends of said first section of said first electrical conductor in parallel with opposite facing sides of said first pyramid at a distance equal to said predetermined level;

coupling fourth and fifth sections of said first electrical conductor respectively extending from said second and third sections of said first electrical conductor to said first electrical conducting strip;

extending second and third sections of said second electrical conductor, respectively, from opposite ends of said first section of said second electrical conductor in parallel with opposite facing sides of said second pyramid at a distance equal to said predetermined level;

coupling fourth and fifth sections of said second electrical conductor respectively extending from said second and third sections of said second electrical conductor to said second electrical conducting strip;

positioning first and second electrical conducting sheets to respectively extend from said oppositely facing sides of said first pyramid, said first and second electrical conducting sheets respectively being with a perpendicular orientation to said common ground plane; and positioning third and fourth electrical conducting sheets to respectively extend from said oppositely facing sides of said second pyramid, said third and fourth electrical conducting sheets respectively being with a perpendicular orientation to said common ground plane.

* * * * *